United States Patent
Chaney et al.

(10) Patent No.: US 10,892,136 B2
(45) Date of Patent: Jan. 12, 2021

(54) ION SOURCE THERMAL GAS BUSHING

(71) Applicant: Varian Semiconductor Equipment Associates, Inc., Gloucester, MA (US)

(72) Inventors: Craig R. Chaney, Gloucester, MA (US); Adam M. McLaughlin, Merrimac, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 256 days.

(21) Appl. No.: 16/101,822

(22) Filed: Aug. 13, 2018

(65) Prior Publication Data

US 2020/0051773 A1    Feb. 13, 2020

(51) Int. Cl.
  *H01J 37/08* (2006.01)
  *H01J 27/02* (2006.01)

(52) U.S. Cl.
  CPC .......... *H01J 37/08* (2013.01); *H01J 27/022* (2013.01)

(58) Field of Classification Search
  CPC .. H01J 37/08; H01J 37/3171; H01J 37/32055; H01J 37/32412; H01J 37/32449; H01J 37/32715; H01J 37/32724; H01J 2237/006; H01J 2237/022; H01J 2237/038
  See application file for complete search history.

(56) References Cited

U.S. PATENT DOCUMENTS

| | | |
|---|---|---|
| 8,807,840 B2 | 8/2014 | House et al. |
| 2004/0114664 A1 | 6/2004 | Park |
| 2007/0191231 A1 | 8/2007 | Ashibe et al. |
| 2012/0033908 A1* | 2/2012 | House ............... F02C 6/12 384/476 |
| 2012/0252195 A1* | 10/2012 | Jones ............... H01J 37/3171 438/514 |
| 2014/0291543 A1 | 10/2014 | Sato et al. |
| 2014/0352617 A1 | 12/2014 | Chaney et al. |

(Continued)

FOREIGN PATENT DOCUMENTS

| | | |
|---|---|---|
| CN | 101998747 A | 3/2011 |
| CN | 108281342 A | 7/2018 |

(Continued)

OTHER PUBLICATIONS

International Search Report and Written Opinion dated Nov. 25, 2019 in corresponding PCT application No. PCT/US2019/042971.

*Primary Examiner* — David E Smith
*Assistant Examiner* — Hsien C Tsai
(74) *Attorney, Agent, or Firm* — Nields, Lemack & Frame, LLC

(57) ABSTRACT

A system for reducing clogging and deposition of feed gas on a gas tube entering an ion source chamber is disclosed. To lower the overall temperature of the gas tube, a gas bushing, made of a thermally isolating material, is disposed between the ion source chamber and the gas tube. The gas bushing is made of a thermally isolating material, such as titanium, quartz, boron nitride, zirconia or ceramic. The gas bushing has an inner channel in fluid communication with the ion source chamber and the gas tube to allow the flow of feed gas to the ion source chamber. The gas bushing may have a shape that is symmetrical, allowing it to be flipped to extend its useful life. In some embodiments, the gas tube may be in communication with a heat sink to maintain its temperature.

18 Claims, 5 Drawing Sheets

(56) References Cited

U.S. PATENT DOCUMENTS

| | | |
|---|---|---|
| 2015/0114930 A1 | 4/2015 | Nonaka et al. |
| 2017/0338075 A1 | 11/2017 | Byl et al. |
| 2018/0190501 A1 | 7/2018 | Ueda |

FOREIGN PATENT DOCUMENTS

| | | | |
|---|---|---|---|
| KR | 10-2007-0102651 A | 10/2007 | |
| TW | 201534762 A | 9/2015 | |
| TW | 201628046 A | 8/2016 | |

* cited by examiner

ION SOURCE THERMAL GAS BUSHING

FIELD

Embodiments of the present disclosure relate to systems for reducing the temperature of a gas tube entering an ion source chamber to minimize the deposition of feed gas in the gas tube.

BACKGROUND

The fabrication of a semiconductor device involves a plurality of discrete and complex processes. One such process may be an etch process, where material is removed from the workpiece. Another process may be a deposition process, wherein material is deposited on the workpiece. Yet another process may be an ion implantation process where ions are implanted into the workpiece.

An ion source is traditionally used to create the ions, which are subsequently used to perform these processes. The ion source may utilize an indirectly heated cathode (IHC), a Bernas source, a capacitively coupled plasma source, or an inductively coupled source disposed within or proximate the chamber of the ion source. A gas tube is in fluid communication with the ion source, in order to supply the desired feed gas to the ion source chamber. The feed gas may be any suitable species, such as a molecule that includes a Group III element, a Group IV element or a Group V element.

During operation, the feed gas enters the ion source chamber, where it is energized by the IHC or other plasma generator. The ionization of the feed gas often causes the ion chamber to be heated to extremely high temperatures, such as greater than 800° C. Since the gas tube is in fluid communication with the ion source, the gas tube typically increases in temperature as well.

This increase in temperature may cause the gasses that are flowing through the gas tube to be deposited on the walls of the gas tube. For example, in certain embodiments, $B_2F_4$ may be used as the feed gas. At high temperatures, the $B_2F_4$ may decompose and deposit on the walls of the gas tube when the gas tube reaches elevated temperatures. This deposition limits the lifetime of the gas tube and accelerates the preventive maintenance schedule of the system.

It would be beneficial if there were a system to reduce the deposition of feed gas within the gas tube. It would also be advantageous if this system reduces the frequency of preventative maintenance.

SUMMARY

A system for reducing clogging and deposition of feed gas in a gas tube entering an ion source chamber is disclosed. To lower the overall temperature of the gas tube, a gas bushing, made of a thermally isolating material, is disposed between the ion source chamber and the gas tube. The gas bushing is made of a thermally isolating material, such as titanium, quartz, boron nitride, zirconia or ceramic. The gas bushing has an inner channel in fluid communication with the ion source chamber and the gas tube to allow the flow of feed gas to the ion source chamber. The gas bushing may have a shape that is symmetrical, allowing it to be flipped to extend its useful life. In some embodiments, the gas tube may be in communication with a heat sink to maintain its temperature.

According to one embodiment, a system for delivering feed gas to an ion source is disclosed. The system comprises a gas tube, having an inner channel in fluid communication with a dopant source; and a gas bushing, having an inner channel in fluid communication with the inner channel of the gas tube and an ion source chamber, wherein the gas bushing has a thermal conductivity of less than 30 W/m K. In certain embodiments, the gas tube is linear. In certain further embodiments, the system comprises an elbow joint disposed between the gas tube and the gas bushing, the elbow joint having an inner channel in fluid communication with the inner channel of the gas tube and the inner channel of the gas bushing. In some embodiments, the gas bushing has an inner surface in communication with the ion source chamber and an outer surface forming an interface with the elbow joint, and wherein a shape of the gas bushing is symmetrical such that the gas bushing can be flipped, wherein when flipped, the inner surface becomes the outer surface. In certain embodiments, the gas bushing and the elbow joint have interlocking features to allow attachment of the gas bushing to the elbow joint. In some embodiments, the inner channel of the gas bushing is not linear. In certain embodiments, the gas bushing and the gas tube have interlocking features to allow attachment of the gas bushing to the gas tube. In some embodiments, the gas tube is non-linear. In certain further embodiments, the gas bushing has an inner surface in communication with the ion source chamber and an outer surface forming an interface with the gas tube, and wherein a shape of the gas bushing is symmetrical such that the gas bushing can be flipped, wherein when flipped, the inner surface becomes the outer surface. In some of these embodiments, a heat sink is in communication with the gas tube.

According to another embodiment, system for delivering feed gas to an ion source is disclosed. The system comprises a gas tube, having an inner channel in fluid communication with a dopant source; an ion source chamber maintained at an elevated temperature; and a gas bushing, constructed of a thermally isolating material, having an inner channel in fluid communication with the inner channel of the gas tube and the ion source chamber, wherein a temperature of the gas tube is more than 200° C. less than the elevated temperature due to the gas bushing. In certain embodiments, the elevated temperature is greater than 800° C. In certain embodiments, a heat sink is in communication with the gas tube. In certain further embodiments, the heat sink is maintained at a temperature between 90° C. and 150° C.

According to another embodiment, a system for delivering feed gas to an ion source is disclosed. The system comprises a dopant source; a gas tube, having an inner channel in fluid communication with the dopant source; an ion source chamber; a heat sink in communication with the gas tube; and a gas bushing, having an inner channel in fluid communication with the inner channel of the gas tube and the ion source chamber so as to deliver feed gas from the dopant source to the ion source chamber, wherein the gas bushing is constructed of a material selected from the group consisting of titanium, quartz, boron nitride, zirconia, and a ceramic material. In certain embodiments, the gas tube is linear and an elbow joint is disposed between the gas tube and the gas bushing, the elbow joint having an inner channel in fluid communication with the inner channel of the gas tube and the inner channel of the gas bushing. In some further embodiments, the gas bushing has an inner surface in communication with the ion source chamber and an outer surface forming an interface with the elbow joint, and wherein a shape of the gas bushing is symmetrical such that the gas bushing can be flipped, wherein when flipped, the inner surface becomes the outer surface. In certain embodiments, the gas tube is non-linear, and the gas bushing has an inner surface in communication with the ion source chamber and an outer surface forming an interface with the gas tube, and a shape of the gas bushing is symmetrical such that the gas bushing can be flipped, wherein when flipped, the inner surface becomes the outer surface.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
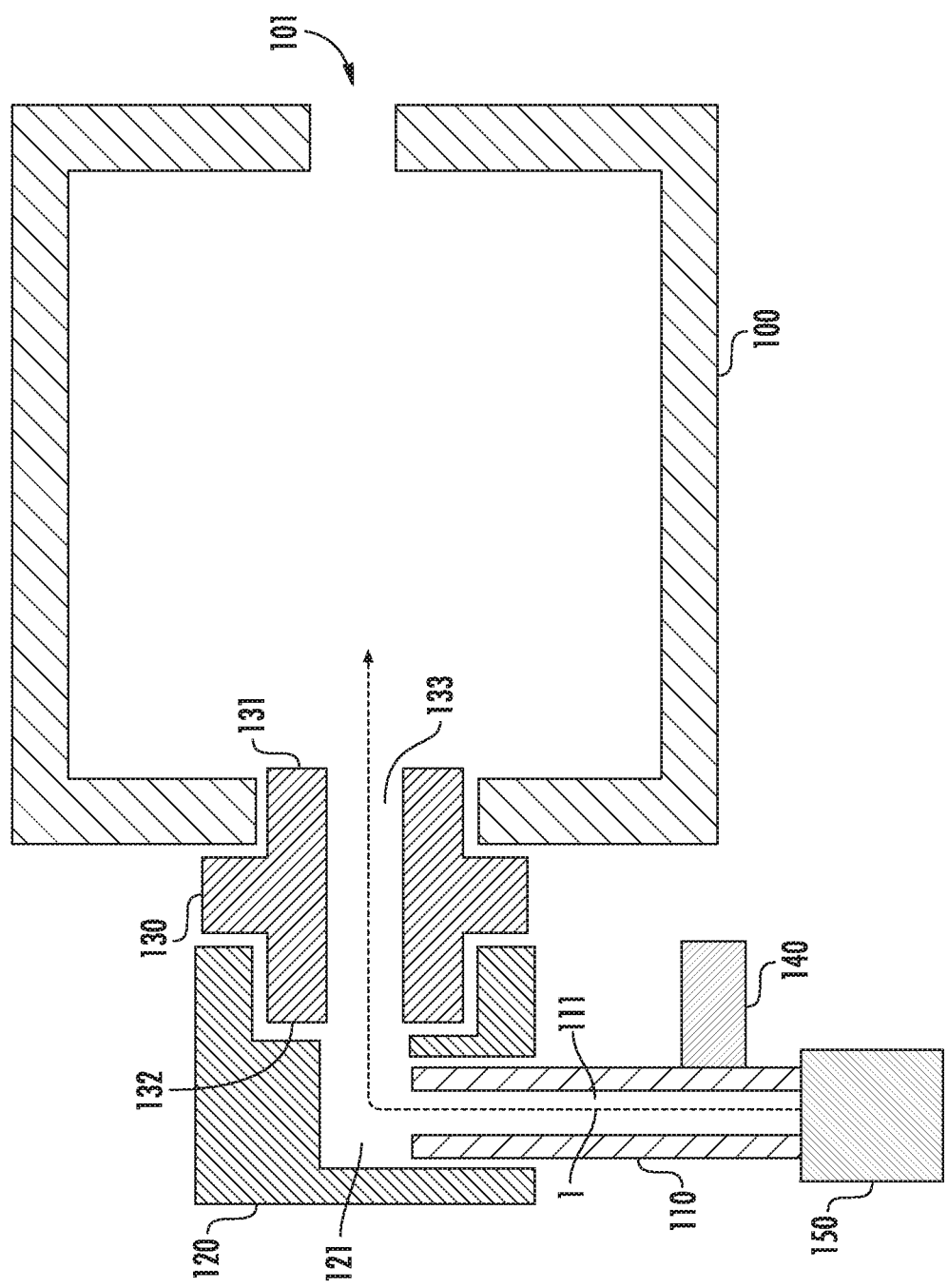
FIG. 1 is a representative view of a dopant source, an ion source chamber and the interconnects therebetween according to one embodiment.

FIG. 1 shows an embodiment of the interconnection between an ion source chamber 100 and a dopant source 150. The ion source chamber 100 is typically constructed from a conductive material, such as tungsten, molybdenum or another metal. The ion source chamber 100 typically has an aperture 101 through which ions that are generated in the ion source chamber 100 can be extracted.

In certain embodiments, the ion source may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 15 MHz. Further, the power supplied by the RF power supply may be pulsed.

In another embodiment, a cathode is disposed within the ion source chamber 100. A filament is disposed behind the cathode and energized so as to emit electrons. These electrons are attracted to the cathode, which in turn emits electrons into the ion source chamber 100. This cathode may be referred to as an indirectly heated cathode (IHC), since the cathode is heated indirectly by the electrons emitted from the filament.

Other embodiments are also possible. In certain embodiments, a Bernas source may be disposed within the ion source chamber 100. In other embodiments, other ion generators, such as capacitively coupled plasma generators or inductively coupled plasma generators, may be disposed within or proximate the ion source chamber 100. The manner in which the plasma is generated in the ion source chamber 100 is not limited by this disclosure.

The dopant source 150 may be a cannister or other container that is used to house the feed gas. The actual shape and form of the dopant source 150 is not limited by this disclosure. The dopant contained within the dopant source 150 may be $B_2F_4$, although other species may also be employed. The gas tube 110 is in fluid communication with the dopant source 150.

The gas tube 110 typically is constructed of a material that is inert and can withstand high temperatures. Furthermore, the material typically is resistant to corrosion and maintains its strength at high temperature. In certain embodiments, the gas tube 110 may be constructed of Stainless Steel, such as SST 316, although other materials may also be used. The gas tube 110 may have an inner diameter of between 0.125 and 0.350 inches. The outer diameter of the gas tube 110 may be between 0.2 and 0.4 inches. The gas tube 110 has an inner channel through which the feed gas 1 may travel. In certain embodiments, such as that shown in FIG. 1, the gas tube 110 may be linear.

The gas tube 110 may be in thermal communication with a heat sink 140. The heat sink 140 may contact the gas tube 110 at its distal end, furthest from the ion source chamber 100. In other embodiments, the heat sink 140 may contact the gas tube 110 at a different position.

In certain embodiments, the heat sink 140 is a mass of thermal conductive material that is maintained at or below a predetermined temperature. In certain embodiments, this predetermined temperature may be between 90° C. and 150° C., although other values may be used. In certain embodiments, the heat sink 140 may be cooled by flowing a coolant fluid through channels in the heat sink 140. Through the use of a heat sink 140, the maximum temperature of the gas tube 110 may be reduced. Consequently, materials with lower melting points may be used to form the gas tube 110.

In certain embodiments, an elbow joint 120 attaches to the gas tube 110. The elbow joint 120 may be constructed of graphite, tantalum, inconel or another similar material. The elbow joint 120 has an inner channel 121. This inner channel may have a curved surface, or may have a more abrupt corner. In certain embodiments, the gas tube 110 is held in place with a friction fit. In another embodiment, the gas tube 110 may be threaded. Similarly, the elbow joint 120 may be threaded. In this embodiment, the gas tube 110 may be screwed into the elbow joint 120. In another embodiment, a slip fit in the direction of flow is used. In another embodiment, the gas tube 110 and elbow joint 120 are held together by interlocking features. The inner channel 111 of the gas tube is in fluid communication with an inner channel 121 of the elbow joint 120.

A gas bushing 130 is in communication with the elbow joint 120 and the ion source chamber 100. More specifically, the gas bushing 130 also has an internal channel 133, in fluid communication with the inner channel 111 of the gas tube 110 and the inner channel 121 of the elbow joint 120 to allow feed gas 1 to flow into the ion source chamber 100. The gas bushing 130 may be attached to the ion source chamber 100. This may be achieved using interlocking features, a friction fit, threaded parts, a slip fit, or by another mechanism. Similarly, the gas bushing 130 may be attached to the elbow joint 120 using any of the mechanisms described above. The gas bushing 130 may have a width of between about 0.125 and 0.500 inches. The width is defined as the distance between the ion source chamber 100 and the elbow joint 120.

The gas bushing 130 may be constructed of a thermally isolating material. The gas bushing 130 may be constructed of a material that has both a low thermal conductivity value and does not interfere with the plasma generation. For example, in some embodiments, the thermal conductivity may be less than 30 W/mK, although other values may be used. For example, the thermal conductivity of a gas bushing having a greater width may be somewhat higher than the thermal conductivity of a thin gas bushing. The material may also be durable to withstand the high temperatures and corrosive plasma environment. Such materials include, but are not limited to, quartz and boron nitride. In other embodiments, titanium, zirconia or a ceramic material such as MACOR® ceramic may be used. The disclosure is not limited to these materials; rather, any material having a high melting point and low thermal conductivity may be used. The material can be selected based on the feed gas being utilized and the amount of thermal isolation desired.

As shown in FIG. 1, the gas bushing 130 is positioned between the ion source chamber 100 and the gas tube 110. The gas bushing 130, because of its thermal isolating properties, prevents heat from being drawn down the gas tube 110 from the ion source chamber 100. By decreasing the transfer of heat down the gas tube 110, the temperature of the ion source chamber 100 increases. Further, the deposition of feed gas is prevented from accumulating in the gas tube 110 which would choke the flow of feed gas 1. In other words, the gas tube 110 operates at a lower temperature due to the use of a thermally isolating gas bushing 130.

In certain embodiments, because the gas bushing 130 faces the interior of the ion source chamber 100, the inner surface 131 of the gas bushing 130 may be eroded by the plasma within the ion source chamber 100. The gas bushing 130 can take a variety of shapes. In one particular embodiment, the shape of the gas bushing 130 is symmetric so that when the inner surface 131 wears, the gas bushing 130 can be flipped and reused. In other words, when flipped, the inner surface 131 becomes the outer surface 132, which is the interface between the gas bushing 130 and elbow joint 120. Further, the surface that was the outer surface 132 now becomes the inner surface 131.

Figure 2:
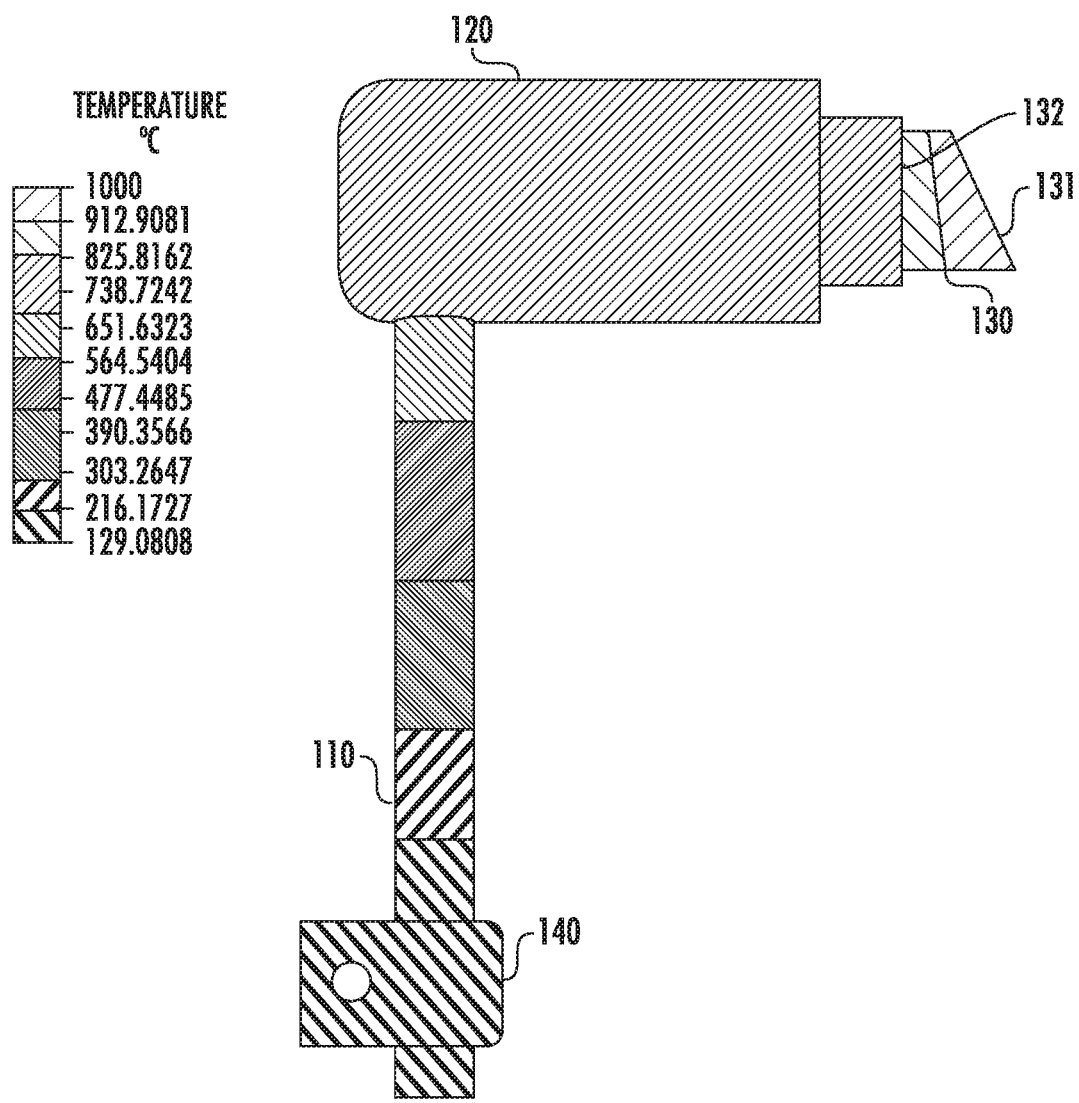
FIG. 2 shows the temperature of the components of FIG. 1 during operation.

A thermal analysis of the embodiment of FIG. 1 was performed assuming that the gas bushing 130 is constructed of quartz. This analysis is shown in FIG. 2. In this analysis, the ion source chamber 100 is assumed to operate at 1000° C. The end of the gas tube 110 furthest from the ion source chamber 100 is assumed to be maintained at 130° C. due to its contact with heat sink 140.

In this thermal analysis, the hottest area is located at the contact point between the gas bushing 130 and the ion source chamber 100, also referred to as the inner surface 131. The inner surface 131 is roughly the temperature of the ion source chamber 100. The temperature gradient across the gas bushing 130 may be as great as 300° C. The temperature gradient is defined as the temperature difference between the inner surface 131 and the outer surface 132 of the gas bushing 130. Because of the use of quartz as the gas bushing 130, the maximum temperature of the elbow joint 120 is reduced to about 650° C. in some embodiments. Consequently, the gas tube 110 operates at temperatures ranging from 130° C. at the end furthest from the ion source chamber 100 to about 600° C. at the interface between the gas tube 110 and the elbow joint 120.

In contrast, when a gas bushing 130 is not used, or when the gas bushing 130 is made from a conductive material, such as graphite, the temperature profile is much different. Specifically, the entirety of the elbow joint 120 is maintained at a temperature very close to that of the ion source chamber 100. Consequently, the gas tube 110 operates at temperatures ranging from 130° C. at the end furthest from the ion source chamber 100 to about 900° C. at the interface between the gas tube 110 and the elbow joint 120.

In other words, the temperature of the end of the gas tube 110 closest to the elbow joint 120 is roughly 300° C. lower using a gas bushing 130 made of a thermally isolating material is used. This reduction in heat minimizes or eliminates the deposition of gas within the gas tube 110.

While FIG. 1 shows an elbow joint 120 disposed between the gas tube 110 and the gas bushing 130, it is understood that this component may have any desired shape. For example, the gas tube 110 may be oriented at a different angle relative to the entry to the ion source chamber 100. This difference in angle may necessitate the use of a joint having a different shape. Thus, the elbow joint 120 is not limited to one in which the two opposite ends are offset by 90°.

Figure 3:
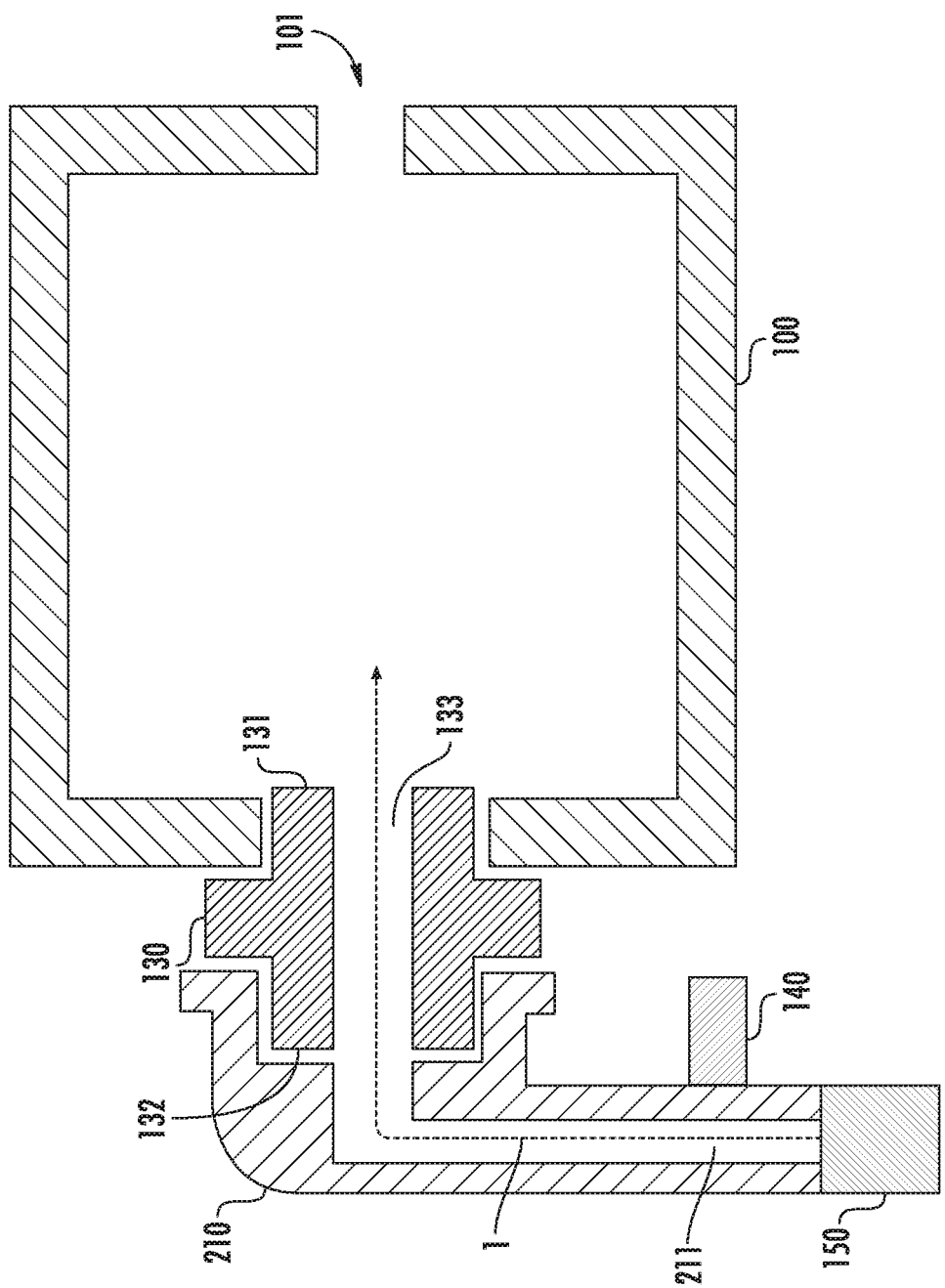
FIG. 3 shows a representative view of a dopant source, an ion source chamber and the interconnects therebetween according to a second embodiment.

Further, other embodiments are also possible. FIG. 3 shows one such embodiment. In this embodiment, the elbow joint is not employed. The dopant source 150, the heat sink 140, the gas bushing 130 and the ion source chamber 100 are as described with respect to FIG. 1. In this embodiment, the gas tube 210 is shaped so as to directly attach to the gas bushing 130. The gas tube 210 may be attached using interlocking features, a friction fit, threaded parts, a slip fit, or by another mechanism. The gas tube 210 has an inner channel 211 through which the feed gas 1 flows. As was described above, the gas bushing 130 is thermally isolating, such that the temperature at the inner surface 131 of the gas bushing 130 is much greater, such as more than 200° C. greater, than the outer surface 132 of the gas bushing 130. In this embodiment, the gas bushing 130 attaches to the gas tube 210, rather than to an elbow joint. However, the function of the gas bushing 130 is unchanged. In certain embodiments, the shape of the gas bushing 130 may be symmetric so that the gas bushing 130 may be flipped. When flipped the inner surface 131 becomes the outer surface 132.

Figure 4:
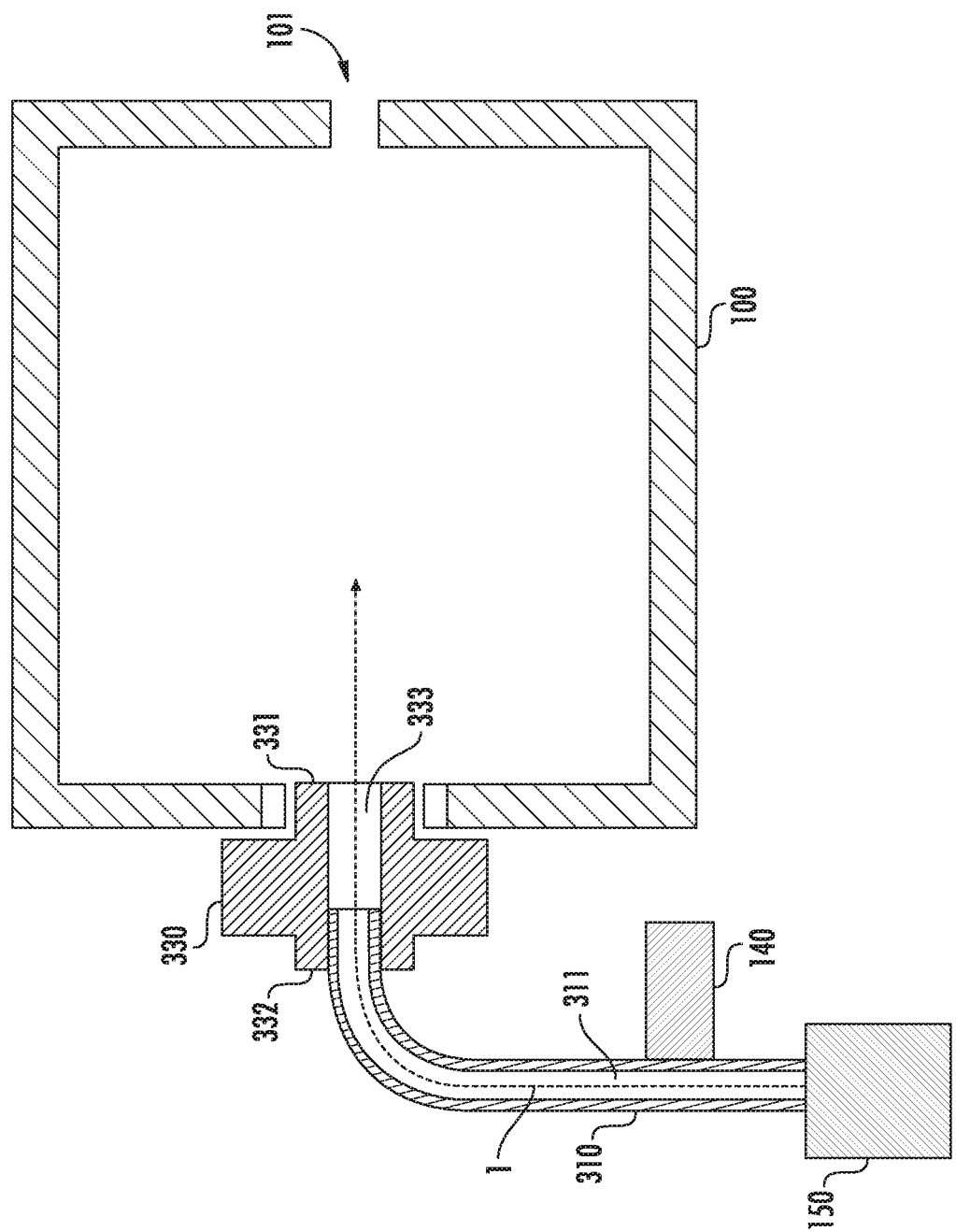
FIG. 4 shows a representative view of a dopant source, an ion source chamber and the interconnects therebetween according to a third embodiment.

FIG. 4 shows an embodiment that is similar to FIG. 3. The dopant source 150, the heat sink 140, the gas bushing 130 and the ion source chamber 100 are as described with respect to FIG. 1. In this embodiment, the gas tube 310 is shaped so as to be inserted into the gas bushing 330. The gas tube 310 also has an inner channel 311 through which the feed gas 1 may flow. Again, the gas bushing 330 is thermally isolating, such that the temperature at the inner surface 331 of the gas bushing 330 is much greater, such as more than 200° C. greater, than the outer surface 332 of the gas bushing 330. The inner channel 333 of the gas bushing 330 is in fluid communication with the inner channel 311 of the gas tube 310.

Figure 5:
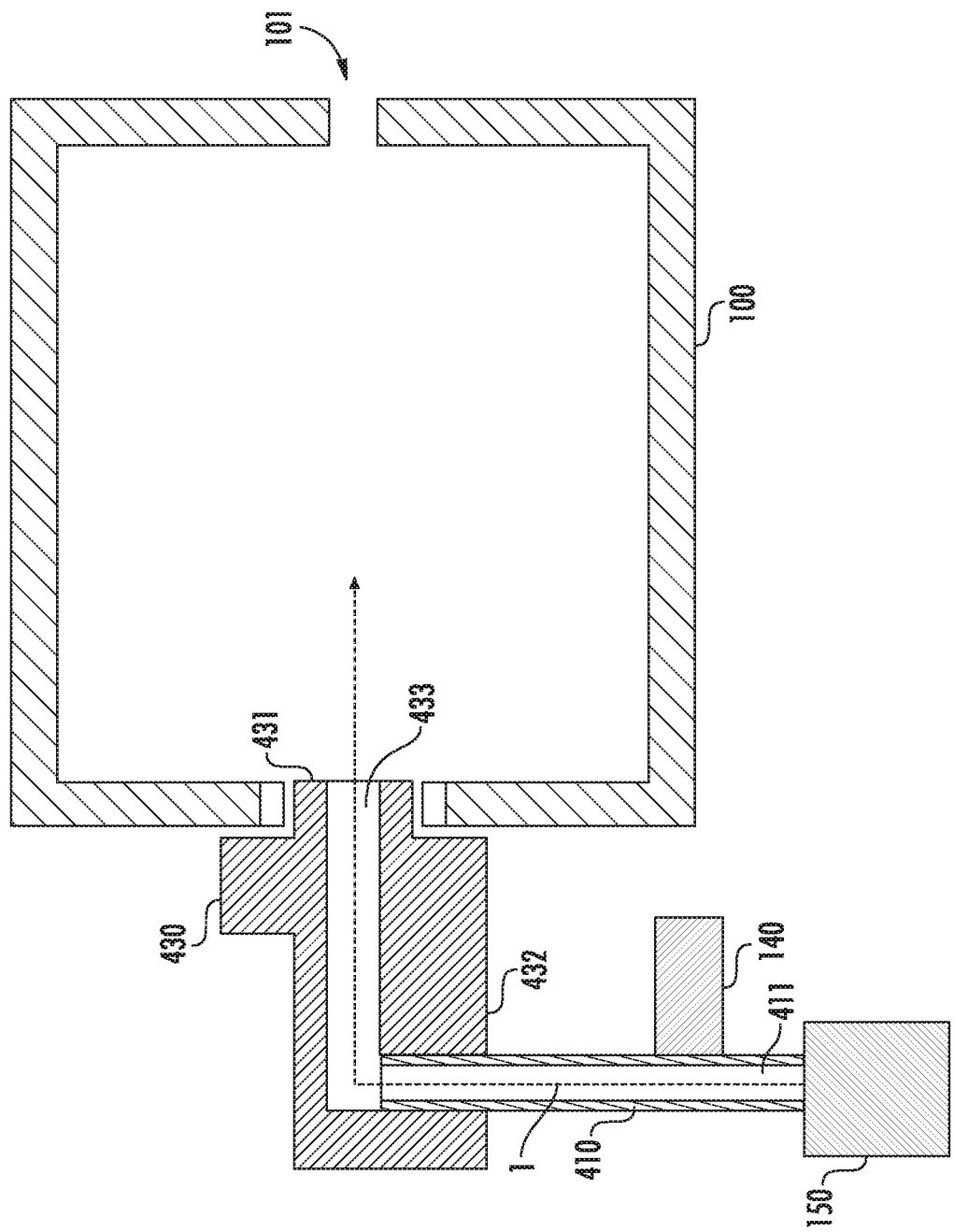
FIG. 5 shows a representative view of a dopant source, an ion source chamber and the interconnects therebetween according to fourth embodiment.

FIG. 5 shows an embodiment wherein the shape of the gas bushing 430 has been modified as compared to the previous embodiments. In this embodiment, the gas tube 410 is linear, much like that shown in FIG. 1, and has an inner channel 411 through which the feed gas 1 flows. The gas bushing 430 has been modified to incorporate the elbow joint of FIG. 1. In other words, the gas bushing 430 includes the connection to the ion source chamber 100, the bend originally found in the elbow joint, and the connection to the gas tube 410. The gas bushing 430 has an inner channel 433, in communication with the inner channel 411 of the gas tube 410 and the ion source chamber 100 to allow feed gas 1 to enter the ion source chamber 100. The inner channel 433 of the gas bushing 430 may be non-linear, as shown in FIG. 5. In certain embodiments, the inner channel 433 may change direction through the inclusion of a radius. In other embodiments, an abrupt corner may be employed. The gas bushing 430 may also have an inner surface 431 that is in communication with the ion source chamber 100, and an outer surface 432 in communication with the gas tube 410.

The embodiments of FIG. 3 through FIG. 5 may be advantageous in that there are fewer components. However, the embodiment of FIG. 1 may be beneficial in terms of cost.

While various embodiments are shown, in certain instances, it may be preferable that the elbow joint 120 or other components that change the direction of the feed gas 1 have an inner channel that has a large radius. A larger radius may result in a smoother, more efficient gas flow with less turbulence. For example, FIG. 4 shows a gas tube 410 with a radius to allow less turbulent flow. A similar radius may be used in the embodiments of FIGS. 1, 3 and 5. For example, the elbow joint 120 of FIG. 1 may be a larger radius for the inner channel 121 to improve the gas flow through the elbow joint 120. Similarly, the gas tube 210 of FIG. 3 may have an inner channel 211 that is more rounded than is shown. Lastly, the gas bushing 430 of FIG. 5 may include an inner channel 433 that is curved.

The system and method described herein have many advantages. In each of these embodiments, a gas bushing, which is thermally isolating, is used to thermally separate the gas tube from the ion source chamber 100. By doing so, the maximum temperature of the gas tube may be reduced. This reduction may be advantageous in that materials with lower melting points may be used to form the gas tube.

Specifically, during operation, the ion source chamber 100 may be maintained at an elevated temperature. This elevated temperature may be greater than 800° C. In certain embodiments, the elevated temperature is between 800° C. and 1200° C. If the ion source chamber 100 is maintained at this elevated temperature, the maximum temperature of the gas tube may be more than 200° C. lower than this elevated temperature. This temperature difference may become larger if the gas tube is in communication with a heat sink.

Furthermore, by reducing the temperature in the gas tube, the possibility of deposition of the feed gas that travels through the gas tube is reduced. This reduces the time and frequency of preventative maintenance for the gas tube. Further, any deposition of feed gas is more likely to occur in the gas bushing due to its elevated temperature. However, in contrast to the gas tube, the gas bushing has a much shorter channel, making it easier and more expeditious to clean. Thus, the preventative maintenance may occur less frequently. Further, because of the use of a gas bushing, the preventative maintenance procedure may be shortened. In one embodiment, the gas bushing is cleaned during the preventative maintenance procedure, but cleaning of the gas tube is optional. In another embodiment, the gas bushing is simply replaced during the preventative maintenance procedure. This helps to increase the operational time of the system.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system for delivering feed gas to an ion source, comprising:
    a gas tube, having an inner channel in fluid communication with a dopant source; and
    a gas bushing, having an inner channel in fluid communication with the inner channel of the gas tube and an ion source chamber, wherein the gas bushing has a thermal conductivity of less than 30 W/m K so as to thermally separate the gas tube from the ion source chamber.

2. The system of claim 1, wherein the gas tube is linear.

3. The system of claim 2, further comprising an elbow joint disposed between the gas tube and the gas bushing, the elbow joint having an inner channel in fluid communication with the inner channel of the gas tube and the inner channel of the gas bushing.

4. The system of claim 3, wherein the gas bushing has an inner surface in communication with the ion source chamber and an outer surface forming an interface with the elbow joint, and wherein a shape of the gas bushing is symmetrical such that the gas bushing can be flipped, wherein when flipped, the inner surface becomes the outer surface.

5. The system of claim 3, wherein the gas bushing and the elbow joint have interlocking features to allow attachment of the gas bushing to the elbow joint.

6. The system of claim 2, wherein the inner channel of the gas bushing is not linear.

7. The system of claim 6, wherein the gas bushing and the gas tube have interlocking features to allow attachment of the gas bushing to the gas tube.

8. The system of claim 1, wherein the gas tube is non-linear.

9. The system of claim 8, wherein the gas bushing has an inner surface in communication with the ion source chamber and an outer surface forming an interface with the gas tube, and wherein a shape of the gas bushing is symmetrical such that the gas bushing can be flipped, wherein when flipped, the inner surface becomes the outer surface.

10. The system of claim 1, comprising a heat sink in communication with the gas tube.

11. A system for delivering feed gas to an ion source, comprising:
    a gas tube, having an inner channel in fluid communication with a dopant source;
    an ion source chamber maintained at an elevated temperature; and
    a gas bushing, constructed of a thermally isolating material, having an inner channel in fluid communication with the inner channel of the gas tube and the ion source chamber, wherein due to the thermally isolating material, a temperature of the gas tube is more than 200° C. less than the elevated temperature due to the gas bushing.

12. The system of claim 11, wherein the elevated temperature is greater than 800° C.

13. The system of claim 11, comprising a heat sink in communication with the gas tube.

14. The system of claim 13, wherein the heat sink is maintained at a temperature of between 90° C. and 150° C.

15. A system for delivering feed gas to an ion source, comprising:
    a dopant source;
    a gas tube, having an inner channel in fluid communication with the dopant source;
    an ion source chamber;
    a heat sink in communication with the gas tube; and a gas bushing, having an inner channel in fluid communication with the inner channel of the gas tube and the ion source chamber so as to deliver feed gas from the dopant source to the ion source chamber, wherein the gas bushing is constructed of a thermally isolating material selected from the group consisting of titanium, quartz, boron nitride, zirconia, and a ceramic material.

16. The system of claim 15, wherein the gas tube is linear and further comprising an elbow joint disposed between the gas tube and the gas bushing, the elbow joint having an inner channel in fluid communication with the inner channel of the gas tube and the inner channel of the gas bushing.

17. The system of claim 16, wherein the gas bushing has an inner surface in communication with the ion source chamber and an outer surface forming an interface with the elbow joint, and wherein a shape of the gas bushing is symmetrical such that the gas bushing can be flipped, wherein when flipped, the inner surface becomes the outer surface.

18. The system of claim 15, wherein the gas tube is non-linear, and wherein the gas bushing has an inner surface in communication with the ion source chamber and an outer surface forming an interface with the gas tube, and wherein a shape of the gas bushing is symmetrical such that the gas bushing can be flipped, wherein when flipped, the inner surface becomes the outer surface.

\* \* \* \* \*